United States Patent [19]
de Jong et al.

[11] Patent Number: 5,138,564
[45] Date of Patent: Aug. 11, 1992

[54] AUTOMATIC ENCODER CALIBRATION

[75] Inventors: Joannes N. M. de Jong, Suffern; Barry Wolf, Yorktown Heights, both of N.Y.

[73] Assignee: Xerox Corporation, Stamford, Conn.

[21] Appl. No.: 560,813

[22] Filed: Jul. 31, 1990

[51] Int. Cl.$^5$ .......................... G06F 11/00; G06F 15/20
[52] U.S. Cl. ........................ 364/571.04; 250/231.14; 364/565; 364/571.01
[58] Field of Search ............ 364/571.01, 571.02, 364/571.03, 571.04, 571.05, 571.06, 571.07, 571.08, 565, 566, 575; 371/30; 250/231.14, 211 R

[56] References Cited
U.S. PATENT DOCUMENTS

| | | | |
|---|---|---|---|
| 3,998,088 | 12/1976 | Kazangey | 364/701 |
| 4,216,419 | 8/1980 | van Dam et al. | 364/571.04 |
| 4,224,515 | 9/1980 | Terrell | 250/231.14 |
| 4,581,713 | 4/1986 | Fennel | 364/571.04 |
| 4,593,193 | 6/1986 | Michaelis | 364/571.04 |
| 4,633,224 | 12/1986 | Gipp et al. | 250/231.14 |
| 4,792,678 | 12/1988 | Spies | 250/211 R |
| 4,803,354 | 2/1989 | Onodera et al. | 371/30 |
| 4,806,752 | 2/1989 | Fischer | 250/231.14 |
| 4,858,158 | 8/1989 | Ishikawa | 364/571.01 |
| 4,873,655 | 10/1989 | Kondraske | 364/571.02 |
| 4,959,797 | 9/1990 | McIntosh | 364/571.04 |
| 4,972,332 | 11/1990 | Luebbering et al. | 364/566 |
| 5,016,187 | 5/1991 | Forkert et al. | 364/571.04 |

Primary Examiner—Kevin J. Teska
Attorney, Agent, or Firm—Oliff & Berridge

[57] ABSTRACT

A method and apparatus provides on-line calibration of low cost encoders by interfacing an encoder with a microprocessor and driving a shaft to which the encoder is attached at a slow constant speed and at a fast constant speed. Data is collected by the microprocessor for the slow and fast speeds and a mathematical analysis is performed which determines the torque disturbances occurring at each point in the rotational cycle of the shaft and which further determines the actual location of each encoder line on the encoder in the rotational cycle of the shaft. By knowing the actual location of each encoder line and the number of counts between encoder lines for a given speed, a high accuracy encoder can be realized at a minimal cost.

4 Claims, 5 Drawing Sheets

AUTOMATIC ENCODER CALIBRATION

CROSS REFERENCES

The present application is one of a series of copending applications containing related technical subject matter. The related applications are U.S. Ser. No. 07/558,295 filed Jul. 26, 1990, now U.S. Pat. No. 5,076,568 and U.S. Ser. No. 07/627,207 filed Dec. 13, 1990.

BACKGROUND OF THE INVENTION

1. Field of the Invention

The present invention relates to encoders, and more particularly to a method for realizing high accuracy encoders at a low cost by interfacing low-cost encoders with a microprocessor. The microprocessor is programmed to compile a table of set points which correspond to the actual spacings of the encoder. If the shaft which the encoder is monitoring maintains a constant speed, a certain number of encoder lines will be detected at a designated time interval or count. A variation from the designated count indicates a variation in the speed of the shaft. Upon detecting the variation in speed, a signal is sent to a motor to selectively influence the speed of the shaft, so that a constant shaft speed is maintained.

2. Discussion of the Related Art

A major expense in the production of closed loop velocity or position servos is the cost of an encoder. Very accurate encoders (Heidenhain) are priced at a few thousand dollars; encoders of medium accuracy cost a few hundred dollars and low accuracy encoders cost as little as 25 dollars. To approximate costs, an increase of one order of magnitude in encoder accuracy increases the price by one order of magnitude.

Thus, a need exists for an autocalibration technique that will provide on-line calibration of low accuracy encoders so that, with only modest increase in cost, they provide the accuracy of the high-priced encoders. By autocalibration, it is meant calibration without comparison to a high accuracy encoder.

The prior art discloses encoders and methods for improving the accuracy. For example, U.S. Pat. No. 4,593,193 to Michaelis discloses an apparatus and method wherein a servo controller uses generated pulses to calibrate an encoder. A counter is used to keep track of encoder pulses, and a memory stores a calculated error of the pulse. U.S. Pat. No. 4,224,515 to Terrell discloses a high-accuracy optical shaft encoder system wherein an encoder outputs a sine wave. The sine wave is compared to a reference sine wave from a frequency generator and is fed back to control the encoder. U.S. Pat. No. 4,633,224 to Gipp et al. discloses an absolute and incremental optical encoder wherein an algorithm is taught which improves encoder accuracy by using an encoder's absolute position signal and incremental position signal and then comparing these to a stored value. U.S. Pat. No. 3,998,088 to Kazangey discloses a testing apparatus for an incremental shaft encoder wherein a gyroscope is used to accurately test the encoder. U.S. Pat. Nos. 4,792,672 to Spies and 4,806,752 to Fischer each disclose an incremental encoder with a clamping device and a laser rotary encoder.

The concept of using a look-up table for calibration purposes is disclosed in U.S. Pat. No. 4,873,655 to Kondraske wherein a sensor conditioning method and apparatus calibrates a sensor by a look-up table generated by a microprocessor.

The prior art, however, fails to provide an autocalibration technique for increasing the accuracy of a low cost encoder so that it can function with the accuracy of a high cost encoder.

SUMMARY OF THE INVENTION

Two primary factors lead to encoder inaccuracy. The first factor is the non-uniform spacing of encoder lines. If the encoder lines are not equally spaced apart or if the encoder is not precisely centered on the shaft, a constant velocity will produce a non-uniform pulse train. The second factor is torque disturbances. By providing a method which identifies and corrects the two primary factors leading to encoder inaccuracy, a high accuracy, low-cost encoder can be realized.

Accordingly, one object of the present invention is to eliminate repeatable errors in an encoder which result from the lines of the encoder being unevenly spaced.

Yet another object of the present invention is to eliminate once around error, i.e., error resulting from the encoder not being situated at the center of the shaft.

Another object is to eliminate velocity error resulting from torque disturbances.

Yet another object of the present invention is to realize a high accuracy encoder by interfacing a low cost encoder with a microprocessor which performs an error detection/correction algorithm.

Another object of the invention is to provide an autocalibration technique in which a low accuracy encoder can be calibrated without reference to a high accuracy encoder.

These and other objects and advantages of the invention are realized by a method and apparatus which determine if perceived velocity variations are due to torque drag and/or non-uniformity of encoder line spacings. By recording a set of data at high velocity and a set of data at low velocity, a mathematical analysis determines a torque profile of torque disturbance occurring during the rotation of the shaft on which the encoder is mounted and a table of set points which corresponds to the actual angular distance between encoder lines. The microprocessor by knowing where torque disturbances occur can send a signal to the motor which drives the shaft to counteract the torque disturbances at the times they occur in the rotational cycle of the shaft. By knowing the actual location and spacing between encoder lines, the microprocessor will realize that for a given constant speed, a predetermined number of clock pulses or counts should appear between adjacent encoder lines. If the count is other than the predetermined number, a signal is sent to the motor to momentarily increase or decrease speed so that an overall constant speed is maintained.

Further, by knowing the angular spacing between encoder lines, a highly accurate low cost encoder system can be realized.

BRIEF DESCRIPTION OF THE DRAWINGS

The invention will be better understood with reference to the drawings wherein.

DETAILED DESCRIPTION OF THE PREFERRED EMBODIMENTS

Figure 1:
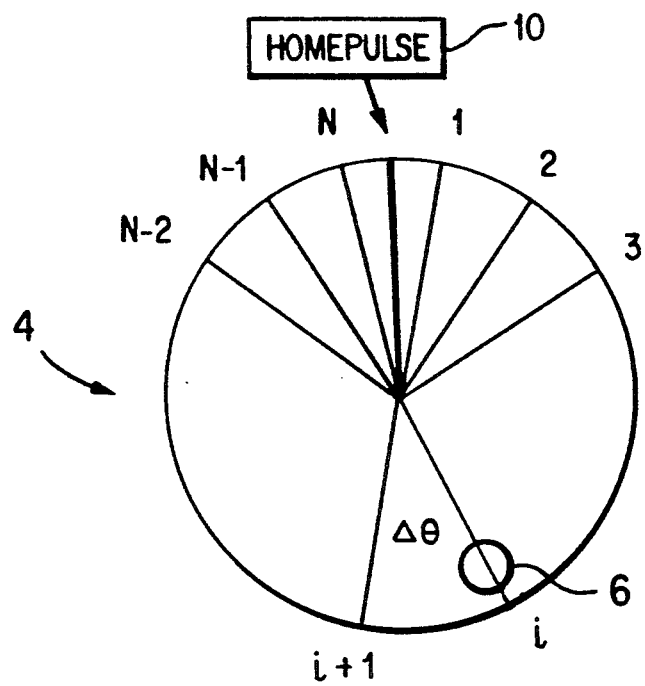
FIG. 1 is a schematic diagram which illustrates an encoder whose encoder lines are unevenly spaced apart.

Referring now to the drawings wherein like reference numerals designate identical or corresponding parts, and more particularly to FIG. 1, encoder 4 has a plurality of lines (e.g., lines 1, 2, 3, i, i+1, N−2, N−1, N) at spaced intervals. Incremental angular encoders may be characterized by the number of lines per revolution (N) on the disc and the placement accuracy of these lines. The encoder is usually attached to a rotating shaft. An incremental increase in shaft position $\Delta\theta$ is measured whenever an encoder line passes stationary detector 6. Detector 6 produces a pulse 8 (FIG. 2) each time an encoder line passes by. A home index pulse 10 is used as a reference for an absolute shaft position $\theta$. The home pulse can originate internally or externally of the encoder.

Figure 2:
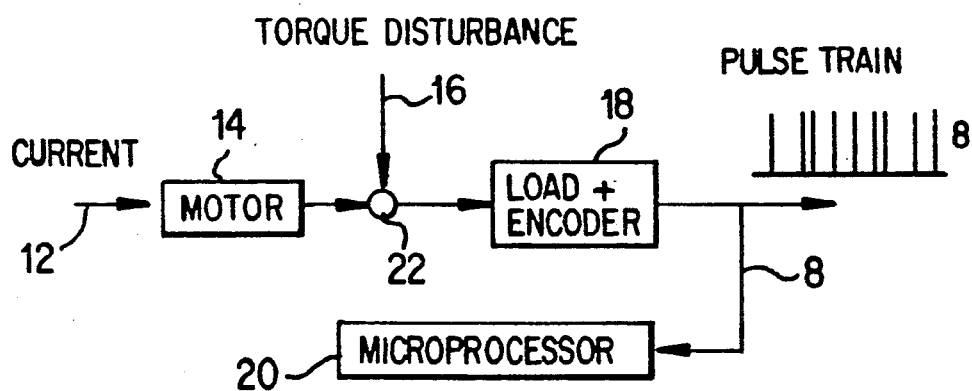
FIG. 2 is a block diagram of an open-loop servo system.

Preferably, the spacing between the lines is constant. High accuracy, high cost encoders attempt to minimize spacing variations and maximize the number of lines. However, in some low accuracy low cost encoders, the spacing or intervals between lines varies thus reducing the encoder accuracy since the line spacing variation introduces an error in shaft position and/or velocity detected by the detector 6. FIG. 2 illustrates how non-uniform line spacing affects encoder accuracy.

FIG. 2 is a block diagram of an open loop servo system which includes the encoder 4 of FIG. 1. Current 12 is supplied to motor 14 which supplies torque to box 18, box 18 representing a load (e.g. shaft) + encoder 4. Encoder 4 outputs a pulse 8 which feeds information to microprocessor 20. The torque disturbance 16 acts as a drag on the torque generated by motor 14. When torque disturbances during the rotational cycle of the shaft occur, these disturbances are summed at summation point 22 with the torque generated by motor 14. Pulse train 8 of FIG. 2 is non-uniform or uneven. Assuming a constant current is supplied to motor 14, this uneven pulse train 8 could be the result of drag on the shaft caused by the torque disturbance or could be the result of uneven encoder line spacing.

Even if an encoder has lines which are evenly spaced apart, the pulse train (for a shaft being driven by a motor supplied by a constant current) can appear non-uniform and varied due to torque disturbances. For example, torque drag can slow the shaft at certain rotational angles of the shaft. The result is the non-uniform time interval pulse train of FIG. 2.

Thus, given a constant current supplied to a motor which drives the shaft on which an encoder is situated, it is possible to determine if an uneven encoder pulse train is the result of encoder imperfection (e.g., uneven line spacings) and/or torque disturbances.

The procedure for separating encoder inaccuracy from torque disturbances uses the data from two independent experiments. The only difference in the two experiments is that the shaft and encoder rotate at velocity $\omega_1$ in the first experiment and at velocity $\omega_2$ in the second experiment. This is accomplished by two different, but constant, test signals (currents) being applied to the motor.

At high speeds, the velocity variations due to torque drag on the shaft are minimized. Therefore, at high speeds an inaccurate pulse train is primarily the result of line spacing variations of the encoder. However, at lower speeds, torque drag can significantly affect shaft speed; thus, at a constant low speed it is difficult to determine whether pulse train variations are due to encoder line spacing problems or torque drag.

By taking a set of data at a constant low velocity and by taking a set of data at a constant high velocity, the below described mathematical analysis (solving two equations for two unknowns) can extract a torque profile and a profile of the line spacings (i.e., angular distance between the lines of the encoder) to determine the actual positioning of the lines of the encoder for a predetermined number of microprocessor clock pulses (the line spacing profile) and the rotational positions of the shaft where torque drag is a significant factor (the torque profile). A look-up table of set points is generated to determine how many clock pulses or counts the microprocessor should detect between each line of the encoder for a desired speed setting.

For example, assume that at a certain speed there should be 10 counts between line 1 and line 2 of encoder 4 (as determined by the formulations described below). If the microprocessor 20 detects 11 counts during this interval, by utilizing its look-up table the microprocessor realizes that the speed is one count off and a signal can be sent to momentarily increase the speed of the motor 20 so overall constant speed is maintained. Conversely, if fewer counts between encoder lines are detected than should be for a given speed, the microprocessor can momentarily decrease the speed of the motor. Also, by knowing the angle or position in the rotating cycle of the shaft that the torque disturbances occur, the microprocessor can selectively send a signal to the motor to counteract the torque disturbances at the appropriate rotational position of the shaft.

The mathematical analysis conducted by the microprocessor for separating and identifying encoder error and torque disturbance is described below. The data which microprocessor 20 accumulates is the time interval $\Delta T$ between passage of encoder lines i and i+1 (i=1,... N+1) for the two experiments (j=1,2). The acceleration profile which is proportional to the torque disturbance profile M, and the actual encoder line spacing $\Delta\theta$ may be calculated using the following equations A and B:

$$\frac{d^2\theta}{dt^2}\bigg|_{i+1} = \frac{\Delta\theta_0}{\Delta T_{0,2}^2 - \Delta T_{0,1}^2}\left[\frac{\Delta T_{i+1,1} - \Delta T_{i,1}}{\Delta T_{0,1}} - \frac{\Delta T_{i+1,2} - \Delta T_{i,2}}{\Delta T_{0,2}}\right] \quad \text{A)}$$

$$i = 1, \ldots N$$

αα

-continued $$\Delta\theta_{i+1} - \Delta\theta_i = \frac{\Delta\theta_0[\Delta T_{0,2}^3(\Delta T_{i+1,1} - \Delta T_{i,1}) - \Delta T_{0,1}^3(\Delta T_{i+1,2} - \Delta T_{i,2})]}{\Delta T_{0,1}\Delta T_{0,2}(\Delta T_{0,2}^2 - \Delta T_{0,1}^2)} \quad B)$$

$$i = 1, \ldots N - 1$$

where the $\Delta\theta_i$'s have the additional condition:

$$\sum_{i=1}^{N} \Delta\theta_i = 2\pi$$

and where:

$\Delta\theta_O$ = average line spacing $2\pi/N$;
$\Delta\theta_i$ = actual line spacing;
$\Delta T_{i,j}$ = time from $\theta_i$ to $\theta_{i+1}$ in experiment j, j=1,2; and $$\Delta T_{o,j} = \text{average } \frac{1}{N} \sum_{i=1}^{N} \Delta T_{ij}$$

The above equations were derived (as detailed below) based on the following assumptions:
(1) the disturbance torque depends on the motor position and velocity, and has the form $$\text{Torque}\left(\theta, \frac{d\theta}{dt}\right) = M(\theta) + P\left(\frac{d\theta}{dt}\right)$$

(2) the motor/load (i.e., motor, shaft and encoder) moves as a rigid body;
(3) variations of $\Delta\theta_o$ are small compared to $\Delta\theta i$.

In what follows, it is further assumed that the motor torque is proportional to motor current. Also, since torque variations have mostly low frequency components, a filter algorithm was designed to reduce unwanted high frequency noise. A more detailed analysis of this filter algorithm is given later in this discussion.

Since the experiments were performed open loop, a slowly drifting velocity was manifested. $\Delta T_{N+1} - \Delta T$ is a measurement of the drift. To compensate for this slow drift, the time interval measurements were corrected by removing it according to:

$$\Delta T_{i,j\text{corr}} = \Delta T_{i,j} - \frac{\Delta T_{N+1,j} - \Delta T_{1,j}}{N}(i-1)$$

$$i = 1, \ldots N + 1$$
$$j = 1,2$$

where:

$\Delta T_{i, j\text{ corr}}$ corrected time interval measurement (drift removed)

A. Experimental Results

In the experiments, a pancake dc motor was used to drive a shaft mounted on bearings. The main disturbance torque was due to the brushes in the motor and the friction of the bearings. At one end of the shaft, the angular position was measured with an eighty tooth gear acting as an encoder. A capacitive transducer measured a gear tooth passing and associated circuitry generated a pulse. At the other end of the shaft a higher accuracy encoder was mounted. The sole purpose of the higher accuracy encoder was to measure the improvement in accuracy of the autocalibrated 80 tooth gear. The time interval between pulses was converted to a digital count with a counter circuit and the count was read by a Motorola 68008 computer, which also provided the computational capabilities. Output was through a 12 bit D/A converter and a power amplifier to drive the motor.

A procedure was developed to iteratively determine the disturbance torque profile and encoder line errors.

Figure 3:
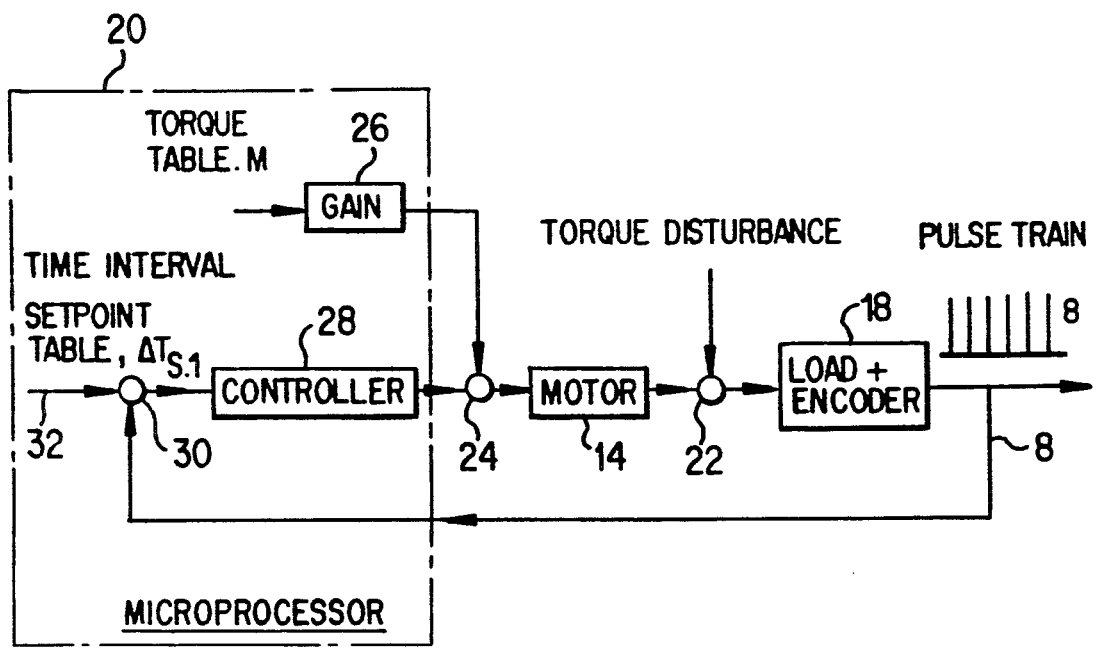
FIG. 3 is a block diagram of the closed-loop servo system of the present invention.

To demonstrate the improvement of the autocalibration technique, a closed loop servo system was designed. With reference to FIG. 3, pulse train 8 is fed back to microprocessor 20. Set point table data 32 is summed at summation point 30 with the information contained in pulse train 8 and the combined information is forwarded to controller 28. A torque disturbance removal signal 26 is combined with the output of controller 28 at summation point 24 and the output signal of controller 28 and torque removal signal 26 are fed to motor 14 which drives the shaft of the encoder (represented by box 18). The torque of motor 14 is combined with torque disturbance 16 at summation point 22.

In addition to the microprocessor 20 performing the autocalibration, it also serves as the closed loop controller 28.

Figure 8:
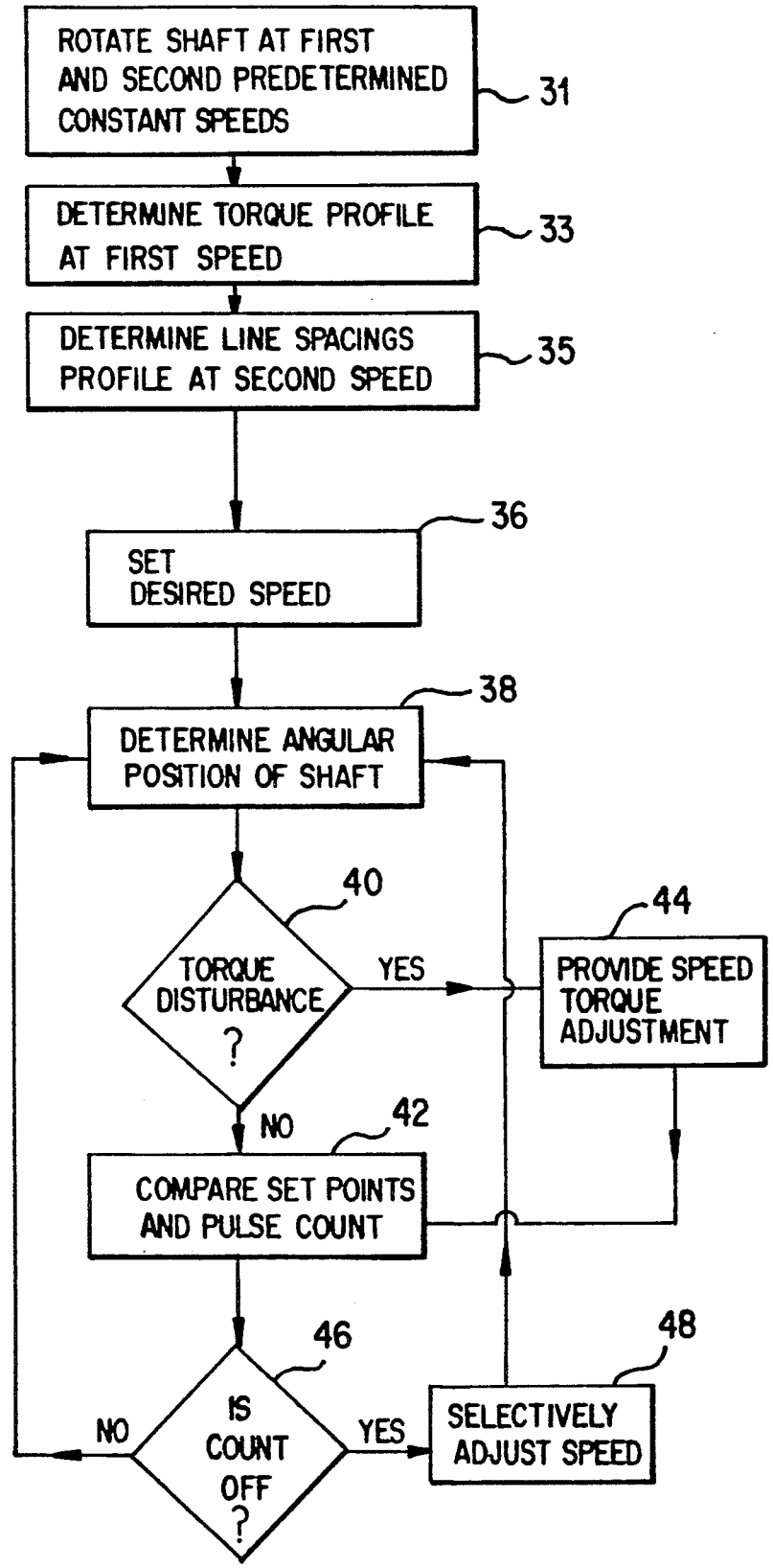
FIG. 8 is a flow chart illustrating an algorithm performed by the microprocessor according to the present invention.

FIG. 8 is a flow chart illustrating the algorithm performed by microprocessor 20/controller 28. The encoder is initially calibrated in step 31 by rotating the shaft at the relatively slow and fast (first and second) predetermined constant speeds. The profile of torque disturbances is generated in step 33 from the pulse train obtained when rotating the shaft at the slow (first) predetermined constant speed, and the profile of line spacings is generated in step 35 from the pulse train obtained when rotating the shaft at the relatively faster (second) predetermined constant speed. A speed is set (step 36) for the shaft on which the encoder is positioned. Home pulse 10 and detector 6 send information to the microprocessor so that the angular position of the shaft at any given time is known (step 38). From the torque profile developed from the experiments conducted, it is known where and when in the rotational cycle of the shaft torque disturbances occur (step 40). If a torque disturbance occurs, a signal is sent from the microprocessor to the motor to counteract the torque disturbance (step 44) so that the speed of the shaft will not be affected from the torque disturbance.

As a further result of the experiments and calculations made from the data accumulated in the experiments, microprocessor 20 generates a look-up table which corresponds to the location of set points (i.e., the actual location of encoder lines on the encoder). At a given speed the microprocessor will have a determinable number of clock pulses between set points (step 42). If the count of clock pulses between set points is other than it should be for a given speed (step 46), a signal is sent to the motor 14 to selectively adjust the speed so that the constant desired speed is realized (step 48).

To further explain, in the present system the disturbance torque profile provides feedforward compensation (i.e., gain 26) and the encoder error profile is used to create a time interval setpoint table where:

$$\Delta T_{s,i} = \frac{\Delta\theta_{i-1}}{\Delta\theta_0} \Delta T_s$$

$\Delta T_{s,1}$ = time interval velocity setpoint at $i^{th}$ encoder line;

$\Delta T_s$ = nominal time interval setpoint;
and as defined previously:
$\Delta\theta_{i-1}$ = encoder line spacing between encoder line (i−1) and (i−2); and
$\Delta\theta_0$ = nominal encoder line spacing.

The assertion is that, for constant velocity servos, the ratio of actual encoder line spacing to the nominal spacing should equal the ratio of the time table interval setpoint to nominal time interval setpoint.

Figure 4:
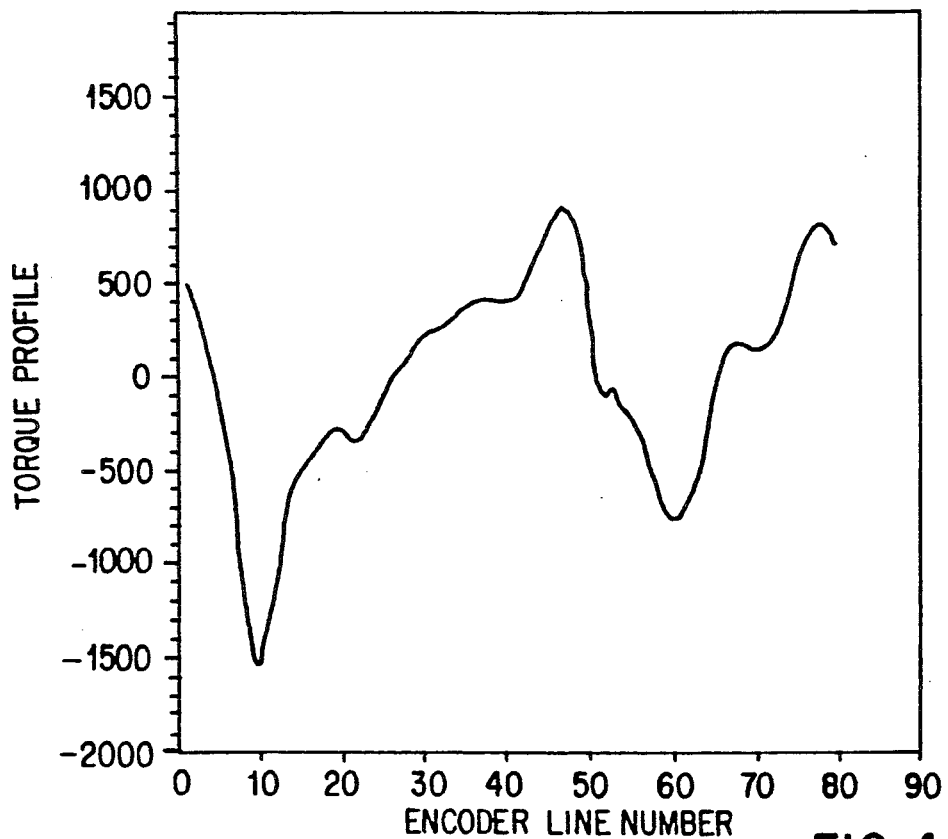
FIG. 4 is a graphical illustration of a torque disturbance profile.
Figure 5:
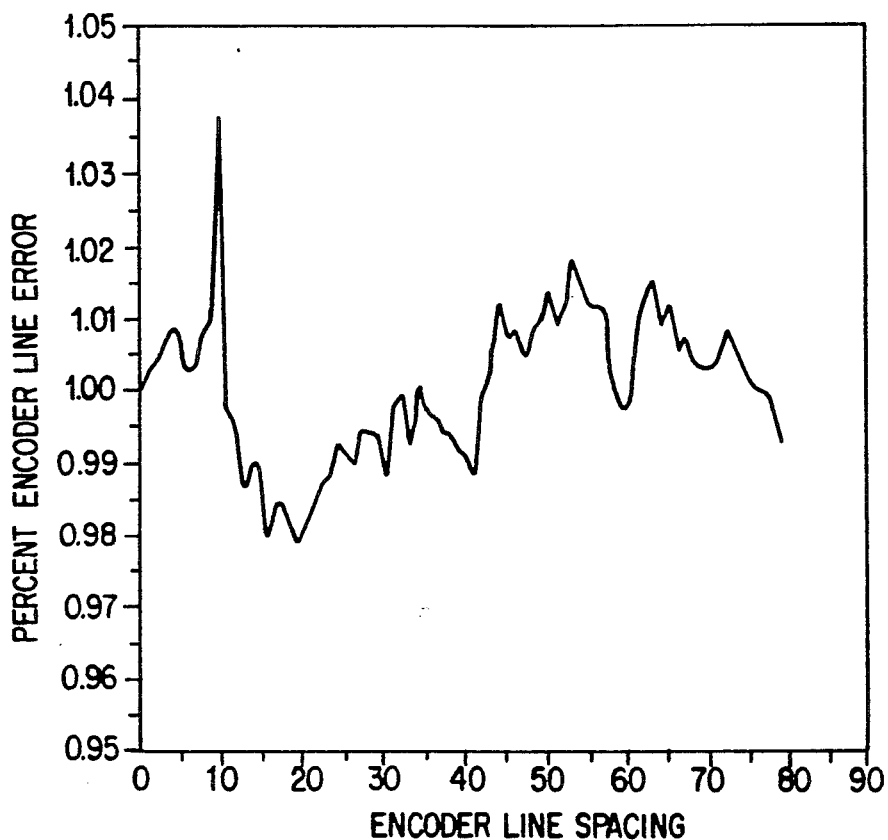
FIG. 5 is a graphical illustration of an encoder line error profile.

Measured disturbance torque profile is shown in FIG. 4. The accuracy of this measurement was checked by rotating the encoder 180° on the shaft. As required, the torque disturbance profile shifted N/2 encoder lines, whereas the encoder line profile remained in the same position relative to the home/index pulse. The encoder line error profile is shown in FIG. 5.

Figure 6:
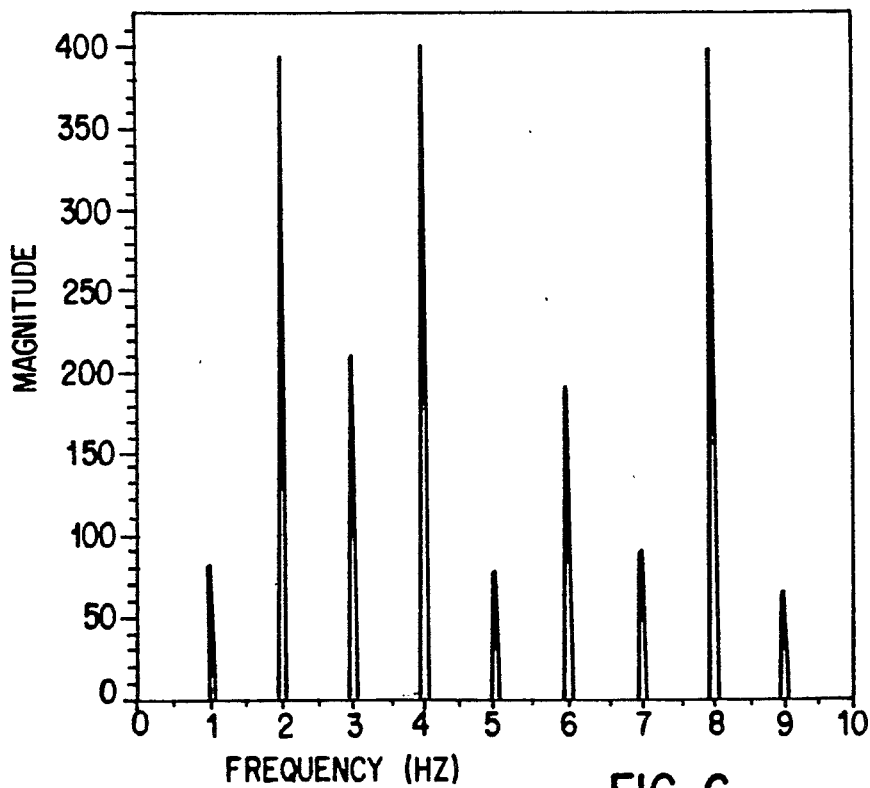
FIG. 6 is a graphical illustration of the spectra of velocity variations when the torque and time interval tables of the present invention are inactive.
Figure 7:
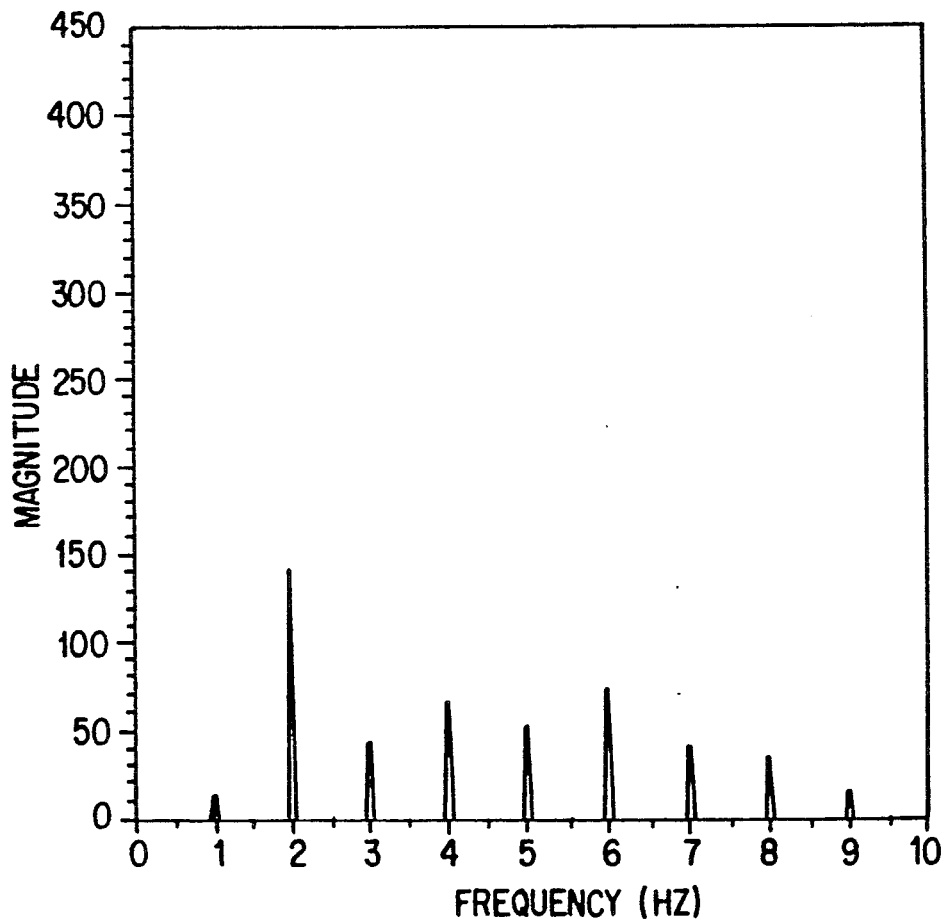
FIG. 7 is a graphical illustration of the spectra of velocity variations when the torque and time interval tables of the present invention are activated.

Comparison of the spectra of time interval (velocity variations) with the torque and time interval tables, inactive and active, are shown in FIGS. 6 and 7 respectively. These measurements were done by measuring time interval variations of the high accuracy encoder with the microprocessor performing the closed loop control.

The graphs of FIGS. 6 and 7 demonstrate that the autocalibration technique of the present invention improved velocity variations by a factor of 4–5 in the previously low accuracy (80 tooth gear) encoder.

B. DEVELOPMENT OF FORMULAE A AND B

The following discussion will focus on how the effects of encoder line error and torque variations are separated and identified.

The torque on the motor has a velocity dependent component M and a position dependent component P. It is assumed that these effects are independent so that the torque on the motor may be written as:

$$\text{Torque}\left(\theta, \frac{d\theta}{dt}\right) = M(\theta) + P\left(\frac{d\theta}{dt}\right) + Q \quad (a1)$$

Here Q is a constant torque that is proportional to the nominal current. The constant bias portion of the resisting torque is included as part of the function P so that the function M is periodic and has a mean value of zero. Note that this function M models mechanical and electromechanical asymmetries (brush commutation, friction variations, bearing runout, etc.). If one assumes that the motor load moves as a rigid body, then the equation of motion is $$J\frac{d^2\theta}{dt^2} = M(\theta) + P\left(\frac{d\theta}{dt}\right) + Q \quad (a2)$$

where J is the moment of inertia of the system.

If the position dependent torque is not present (i.e., $M(\theta)=0$), a constant current to the motor will drive the motor with constant speed. That is, $d\theta/dt = \omega_O$ (constant) with $\omega_0$ satisfying $P(\omega_0=0)+Q=0$ being a solution of equation (a2). If instead, the torque $M(\theta)$ is present but small (i.e., $M(\theta)=\epsilon m(\theta), \epsilon<<1$), then equation (a2) may be written as:

$$J\frac{d^2\theta}{dt^2} = \epsilon m(\theta) + P\left(\frac{d\theta}{dt}\right) + Q \quad (a3)$$

Further, in this case one would expect the velocity to have the nominal value $\omega_0$ with a variation of order $\epsilon$ about this value. That is, $d\theta/dt = \omega_0 + \epsilon\Omega$. When this is used in (a3) one obtains:

$$J\frac{d\Omega}{dt} = \epsilon m(\theta) + P(\omega_0 + \epsilon\Omega) + Q$$

or to first order in $\epsilon$:

$$J\epsilon\frac{d\Omega}{dt} = \epsilon m(\theta) + P(\omega_0) + \frac{dP(\omega_0)}{d\omega_0}\epsilon\Omega + Q$$

but, since $P(\omega_0)+Q=0$, one obtains:

$$J\frac{d\Omega}{dt} = m(\theta) + \frac{dP(\omega_0)}{d\omega_0}\Omega \quad (a4)$$

The conditions under which the velocity variation $\Omega$ has weak dependence on the velocity dependent torque term are now determined. That is, it is of interest to define the conditions under which the term:

$$dP\frac{(\omega_0)}{d\omega_0}\Omega$$

appearing in (a4) has significantly less influence on the velocity than the term $m(\theta)$. To arrive at this condition it is convenient to rewrite (a4) in the form:

$$J\omega_0\frac{d\Omega}{d\theta} = m(\theta) + \frac{dP(\omega_0)}{d\omega_0} \quad (a5)$$

Since $m(\theta)$ is periodic, let $m(\theta) = \Sigma c_k e^{jk\theta}$ (where $c_K$ is a constant and e is a number closely equal to 2.71828) and use this in (a5) to obtain:

$$\frac{d\Omega}{d\theta} + \beta\Omega = \frac{\Sigma c_k e^{jk\theta}}{J\omega_0} \quad (a6)$$

where:

$$\beta = -\frac{1}{J\omega_0}\frac{dP(\omega_0)}{d\omega_0}$$

This yields the steady state behavior:

$$\Omega = \sum_k \frac{c_k e^{jk\theta}}{J\omega_0(\beta + jk)} \quad (a7)$$

which suggests that if $|\beta|<<k$ for all k (or $|\beta|<<1$), the velocity variation $\Omega$ has weak dependence on the velocity dependent torque term. This condition is not very prohibitive; it is satisfied for most systems. (Note: The parameter $\beta$ is not difficult to measure. For the experiments conducted $\beta$ was equal to 0.02).

As has been discussed, the separation of encoder line error effects from the effect of torque variation requires two experiments performed at different nominal speeds. During these experiments the time interval between the passing of encoder lines is measured. The details of the procedure which uses this acquired data to separate line error from torque variation are described here.

The acceleration experienced by the system when the $i^{th}$ encoder line passes the detector 6 in experiment j (j=1,2) may be approximated by $$\left.\frac{d^2\theta}{dt^2}\right|_{i+1,j} = \frac{\frac{\Delta\theta_{i+1}}{\Delta T_{i+1,j}} - \frac{\Delta\theta_i}{\Delta T_{i,j}}}{\frac{\Delta T_{i+1,j} + \Delta T_{i,j}}{2}} \quad \text{(a8)}$$

$$i = 1, \ldots, N$$
$$j = 1,2$$

$\Delta\theta_i$ = actual line spacing; and
$\Delta T_{i,j}$ = time from $\theta_i$ to $\theta_{i+1}$ in experiment j, j=1,2. It has been argued that for most systems the velocity variation $\Omega$ has weak dependence on the velocity dependent torque term. It follows, therefore, that it has weak dependence on the nominal speed and hence on the experiment j. Thus, the torque, and therefore the acceleration, does not depend on j and to reflect this independence $$\left.\frac{d^2\theta}{dt^2}\right|_{i+1,j} \text{ is replaced by } \left.\frac{d^2\theta}{dt^2}\right|_{i+1}$$

Since the variation of the encoder line spacing $\epsilon\Phi_i$ and the variation of the time intervals $\epsilon t_{i,j}$ from their average values is small, one may write:

$$\Delta\theta_i = \Delta\theta_0 + \epsilon\Phi_i \text{ and } \Delta T_{ij} = \Delta T_{oj} + \epsilon t_j; \epsilon << 1 \quad \text{(a9)}$$

Using (a9) in (a8) and retaining terms to order $\epsilon$, one obtains:

$$\left.\frac{d^2\theta}{dt^2}\right|_{i+1} = \frac{\Delta T_{0,j}(\phi_{i+1} - \phi_i) - \Delta\theta_0(t_{i+1,j} - t_{i,j})}{\Delta T_{0,j}^3} \quad \text{(a10)}$$

$$i = 1, \ldots, N$$
$$j = 1,2$$

and (a10), written explicitly for j=1,2, may be put in the form:

$$\left.\frac{d^2\theta}{dt^2}\right|_{i+1} = \quad \text{(a11)}$$

$$\frac{\Delta T_{0,1}(\Delta\theta_{i+1} - \Delta\theta_i) - \Delta\theta_0(\Delta T_{i+1,1} - \Delta T_{i,1})}{\Delta T_{0,1}^3} \quad i = 1, \ldots, N$$

and $$\left.\frac{d^2\theta}{dt^2}\right|_{i+1} = \quad \text{(a12)}$$

$$\frac{\Delta T_{0,2}(\Delta\theta_{i+1} - \Delta\theta_i) - \Delta\theta_0(\Delta T_{i+1,2} - \Delta T_{i,2})}{\Delta T_{0,2}^3} \quad i = 1, \ldots, N$$

Eliminating the term $\Delta\theta_i - \Delta\theta_{i-1}$ between these equations yields:

$$\left.\frac{d^2\theta}{dt^2}\right|_{i+1} = \quad \text{(a13)}$$

-continued $$\frac{\Delta\theta_0}{\Delta T_{0,2}^2 - \Delta T_{0,1}^2}\left[\frac{\Delta T_{i+1,1} - \Delta T_{i,1}}{\Delta T_{0,1}} - \frac{\Delta T_{i+1,2} - \Delta T_{i,2}}{\Delta T_{0,2}}\right]$$

$$i = 1, \ldots, N$$

which is proportional to the position dependent portion of the torque variation. The proportionality constant is determined automatically during the calibration experiment. Further, by eliminating $\Delta\theta_i$ form these same equations, one obtains:

$$\Delta\theta_{i+1} - \Delta\theta_i = \quad \text{(a14)}$$

$$\frac{\Delta\theta_0[\Delta T_{0,2}^3(\Delta T_{i+1,1} - \Delta T_{i,1}) - \Delta T_{0,1}^3(\Delta T_{i+1,2} - \Delta T_{i,2})]}{\Delta T_{0,1}\Delta T_{0,2}(\Delta T_{0,2}^2 - \Delta T_{0,1}^2)}$$

$$i = 1, \ldots, N$$

These relations, together with the closure relation $$\sum_{i=1}^{N} \Delta\theta_i = 2\pi \quad \text{(a15)}$$

allow for the determination of the actual encoder line spacing.

C. FILTER ALGORITHM

The discussion which follows concerns the computations inherent in the design of the filter algorithm, previously mentioned, which reduces unwanted high frequency noise and allows accurate detection of the low frequency torque variations after the low speed and high speed experiments have been conducted.

A filter with a continuous time transfer function of:

$$\frac{Y(s)}{X(s)} = \frac{1}{1 + \tau s} \quad \text{(A1)}$$

X(s) = input of the filter;
Y(s) = filtered output;
$\tau$ = time constant;
s = Laplace operator;
can be approximated by the discrete time difference equation:

$$Y_i = ay_{i-1} + (1-a)x_i \quad \text{(A2)}$$

Where the time constant $\tau$ and the parameter "a" are related through:

$$a = e^{-\frac{\Delta t}{\tau}}$$

$\Delta t$ = sample time interval.
Filtering with a continuous time transfer function (equation A1) necessarily introduces a phase shift, given by $$\Phi = -\arctan \omega\tau$$

$\omega$ = frequency of input signal.
Discrete time filter algorithms (equation A2) exhibit an equivalent phase shift. However, when discrete time series are stored in the form of a record, one can filter without a phase shift. The procedure consists of first feeding the time series forward through the algorithm and, then, feeding the same time series backward through the algorithm. This cancels positive and negative phase shift while filtering higher frequencies with second order roll-off. The following describes discrete points which can be programmed into the filter algorithm:

discrete time series of period N to be filtered $$x_i \; i=1,\ldots N$$

to reduce the influence of initial conditions, the time series is first extended and, after filtering, the middle part is used as the filtered output $$X_i \; i=1,\ldots N$$

where $X_i = X_{i+N} = X_{i+N} = X_{i+2N} = x_i \; i=1, \ldots N$

| | | |
|---|---|---|
| use filter | $Y_i = aY_{i-1} + (1-a)X_i$ | $i = 2,\ldots 3N$ |
| with initial condition | $Y_i = X_i$ | |
| invert tie series | $Z_i = Y_{3N+1-i}$ | $i + 1, 2, \ldots 3N$ |
| use filter | $V_i = aV_{i-1} + (1-a)Z_i$ | $i = 2,\ldots 3N$ |
| with initial condition | $V_1 = Z_i$ | |
| use middle part of series | $U_i = V_{2N+1-i}$ | $i = 1,\ldots N$ |

Since the time series is passed twice through the discrete time filter, the effect of the filter is equivalent to a second order filter without phase shift which is not physically realizable with analog hardware.

The foregoing detailed description is intended to be illustrative and not limiting. Many modifications and variations are apparent from the foregoing description of the invention and all such modifications and variations are intended to be within the scope of the present invention as defined in the following claims.

What is claimed is:

1. A method of controlling velocity variations of a rotating shaft having on encoder mounted on the shaft, the method comprising the steps of:
   rotating the shaft at firs and second predetermined constant speeds to generate first and second pulse trains, respectively, from detection of line spacings on the encoder;
   determining a profile of torque disturbances from the first pulse train when rotating the shaft at the first predetermined constant speed, the torque disturbance profile corresponding to angular positions of the shaft subject to torque drag;
   determining a profile of line spacings from the second pulse train when rotating the shaft at the second predetermined constant speed, the line spacings profile corresponding to an actual number of line spacings to be sensed for a predetermined time interval;
   rotating the shaft at a desired speed to obtain a pulse train of actual encoder pulses from the detection of the line spacings on the encoder;
   comparing the pulse train of actual encoder pulses to the torque disturbance profile to generate a torque disturbance removal signal;
   comparing the pulse train of actual encoder pulses to the line spacings profile to generate a set point correction signal; and
   varying the desired speed in response to both the set point correction signal and the torque disturbance removal signal.

2. The method of claim 1, wherein the first predetermined constant speed is relatively slower than the second predetermined constant speed.

3. An apparatus for controlling velocity variations of a rotating shaft, comprising:
   means for rotating the shaft at a plurality of rotational speeds;
   encoder means mounted on the shaft and having a plurality of line spacings for outputting a pulse train representative of the rotational speed of the shaft;
   means for determining a profile of torque disturbances from a first pulse train generated by rotating the shaft at a first predetermined constant rotational speed, the torque disturbance profile corresponding to angular positions of the shaft subject to torque drag;
   means for determining a profile of line spacings from a second pulse train generated by rotating the shaft at a second predetermined constant rotational speed, the line spacings profile corresponding to an actual number of lines to be sensed for a predetermined time interval;
   means for comparing a pulse train of actual encoder pulses generated by rotating the shaft at a desired rotational speed to the torque disturbance profile to generate a torque disturbance removal signal, and to the line spacings profile to generate a set point correction signal; and
   controller means for varying the desired speed in response to both the set point correction signal and the torque disturbance removal signal.

4. The apparatus of claim 3, wherein the first predetermined constant speed is relatively slower than the second predetermined constant speed.

* * * * *